(12) United States Patent
Bai et al.

(10) Patent No.: US 9,412,760 B1
(45) Date of Patent: Aug. 9, 2016

(54) ARRAY SUBSTRATE AND MANUFACTURING METHOD THEREOF, AND DISPLAY DEVICE

(71) Applicants: BOE Technology Group Co., Ltd., Beijing (CN); Beijing BOE Display Technology Co., Ltd., Beijing (CN)

(72) Inventors: Jinchao Bai, Beijing (CN); Zongjie Guo, Beijing (CN); Xiangqian Ding, Beijing (CN); Xiaowei Liu, Beijing (CN); Yao Liu, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/738,358

(22) Filed: Jun. 12, 2015

(30) Foreign Application Priority Data

Feb. 9, 2015 (CN) .......................... 2015 1 0067673

(51) Int. Cl.
| | | |
|---|---|---|
| *H01L 27/12* | (2006.01) | |
| *G02F 1/1368* | (2006.01) | |
| *G02F 1/1362* | (2006.01) | |
| *H01L 29/49* | (2006.01) | |
| *H01L 29/45* | (2006.01) | |

(52) U.S. Cl.
CPC .......... *H01L 27/1218* (2013.01); *G02F 1/1368* (2013.01); *G02F 1/136227* (2013.01); *G02F 1/136286* (2013.01); *H01L 27/124* (2013.01); *H01L 27/127* (2013.01); *H01L 27/1262* (2013.01); *H01L 27/1288* (2013.01); *H01L 29/45* (2013.01); *H01L 29/495* (2013.01); *H01L 29/4908* (2013.01)

(58) Field of Classification Search
None
See application file for complete search history.

(56) References Cited

U.S. PATENT DOCUMENTS

| | | | |
|---|---|---|---|
| 2015/0187640 A1* | 7/2015 | Wu | H01L 21/76805 257/72 |
| 2015/0187948 A1* | 7/2015 | Misaki | H01L 29/41733 257/43 |

* cited by examiner

*Primary Examiner* — Bilkis Jahan
(74) *Attorney, Agent, or Firm* — Banner & Witcoff, Ltd.

(57) ABSTRACT

An array substrate including a base substrate is disclosed; the base substrate is divided into a pixel region and a peripheral circuit region, the pixel region sequentially includes a gate electrode, a gate insulation layer, a semiconductor active layer, a pixel electrode, a source/drain electrode, a passivation layer and a common electrode; the peripheral circuit region sequentially includes a first circuit line, the gate insulation layer, a second circuit line and the passivation layer. An orthogonal projection area of the second circuit line is at least partly overlapped with an orthogonal projection area of the first circuit line on the base substrate, and the second circuit line is directly electrically connected with the first circuit line through a via hole penetrating the gate insulation layer. A method for manufacturing the array substrate and a display device including the array substrate are also disclosed.

8 Claims, 6 Drawing Sheets

ARRAY SUBSTRATE AND MANUFACTURING METHOD THEREOF, AND DISPLAY DEVICE

This application claims priority to Chinese Patent Application No. 201510067673.3 filed on Feb. 9, 2015. The present application claims priority to and the benefit of the above-identified application and is incorporated herein in its entirety.

TECHNICAL FIELD

Embodiments of the present disclosure relate to an array substrate and a manufacturing method thereof, and a display device.

BACKGROUND

In the current thin film transistor liquid crystal display (TFT-LCD) industry, a narrow frame configuration has become a trend. In order to achieve a narrow frame, it is necessary to reduce the area occupied by peripheral circuits outside the pixel region as much as possible, and the most common used method is to employ gate-driver-on-array (GOA) technology. The GOA technology involves preparing gate driving circuits on an array substrate, and thus externally connected gate driving integral circuits can be omitted. But GOA units need a number of via holes and transparent electrodes for connecting circuit lines formed by a gate metal layer and circuit lines formed by a source/drain metal layer, which will occupy a large area and thus the narrow frame of the thin film transistor liquid crystal display cannot be minimized.

SUMMARY

Embodiments of the present disclosure provide an array substrate and a manufacturing method thereof, and a display device by which a width of peripheral circuit region of a display panel can be reduced and thus a narrow frame display can be achieved.

An embodiment of the present disclosure provides an array substrate including a base substrate, and the base substrate is divided into a pixel region and a peripheral circuit region, the pixel region comprises a gate electrode, a gate insulation layer, a semiconductor active layer, a pixel electrode, a source/drain electrode, a passivation layer and a common electrode sequentially located on the base substrate, and the peripheral circuit region includes a first circuit line, the gate insulation layer, a second circuit line and the passivation layer sequentially located on the base substrate, wherein an orthogonal projection area of the second circuit line on the base substrate is at least partly overlapped with orthogonal projection area of the first circuit line on the base substrate, and the second circuit line is directly electrically connected with the first circuit line through a via hole penetrating the gate insulation layer.

An embodiment of the present disclosure further provides a method for manufacturing the array substrate including the steps of: sequentially forming a gate electrode and a first circuit line, a gate insulation layer and a semiconductor active layer on a base substrate, wherein the gate electrode and the semiconductor active layer are located in a pixel region and the first circuit line is located in a peripheral circuit region; depositing a transparent conductive layer on the base substrate on which the above step has been completed, coating photoresist on the transparent conductive layer, exposing and developing the photoresist by using a mask plate to form a photoresist fully-removed area, a photoresist partly retained area and a photoresist fully-retained area; the photoresist fully-retained area corresponding to an area in which pixel electrodes are formed, and an orthogonal projection area of the photoresist fully-removed area on the base substrate being at least partly overlapped with an orthogonal projection area of the first circuit line on the base substrate; etching the photoresist fully-removed area, the photoresist partly retained area and the photoresist fully-retained area, to form a pixel electrode in the pixel region and a via hole in the peripheral circuit region, the via hole penetrating the gate insulation layer to at least expose part of the first circuit line; sequentially forming a source/drain electrode and a second circuit line, a passivation layer, a common layer on the base substrate on which the above steps have been completed, wherein the source/drain electrode is located in the pixel region, and the second circuit line is located in the peripheral circuit region and is directly electrically connected with the first circuit line by the via hole.

DESCRIPTION OF THE ACCOMPANYING DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
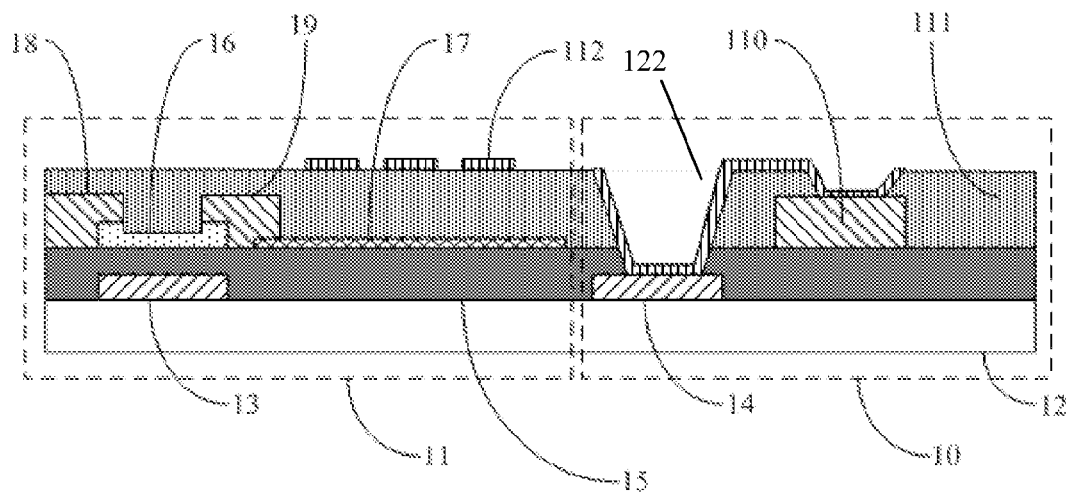
FIG. 1 is a schematic diagram showing the cross-section structure of an array substrate.

FIG. 1 is a cross-sectional diagram of an array substrate. The array substrate includes a base substrate 12. The base substrate 12 is divided into a pixel region 11 and a peripheral circuit region 10. On the base substrate 12, a gate electrode 13 and a circuit line 14 formed by a gate metal layer are provided. The circuit line 14 is located in the peripheral circuit region 10. The gate electrode 13 and the circuit line 14 are provided with a gate insulation layer 15 thereon. The gate insulation layer 15 is provided with a semiconductor active layer 16 thereon. The semiconductor active layer 16 at a side thereof is provided with a pixel electrode 17. The pixel electrode 17 on its upper side is provided with a source electrode 18, a drain electrode 19 and a circuit line 110 formed by a source/drain metal layer. The drain electrode 19 is electrically connected with the pixel electrode 17. The circuit line 110 is located in the peripheral circuit region 10. On the source electrode 18, the drain electrode 19 and the circuit line 110, a passivation layer 111 is provided. On the passivation layer 111, a common electrode 112, which is a transparent electrode, is provided. In the peripheral circuit region 10, when it is necessary to connect the circuit line 14 and the circuit line 110 together to transmit signals, a transparent electrode 122 formed in the same layer as the common electrode 112 connects the circuit line 14 and the circuit line 110 together through a via hole penetrating the gate insulation layer 15 and the passivation layer 111.

In the peripheral circuit region of the above array substrate, a number of via holes and transparent electrodes are needed to respectively connect the circuit lines formed by the gate metal layer and the circuit lines formed by the source/drain metal layer, thus a large available area in the peripheral circuit region is occupied, and the width of the peripheral circuit region in a display penal is caused to be relatively large.

According to the embodiments of the present disclosure, an array substrate and its manufacturing method, and a display device are provided, by which the width of the peripheral circuit region in the display penal is reduced, and narrow frame display can be achieved.

Figure 2:
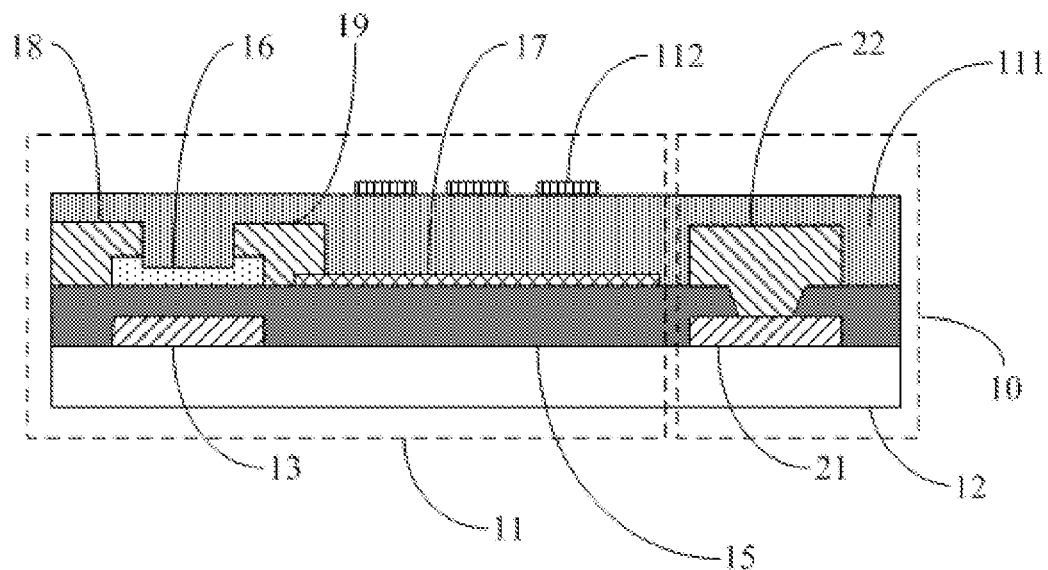
FIG. 2 is a schematic diagram showing the cross-section structure of an array substrate provided by an embodiment of the present disclosure.

FIG. 2 is a schematic diagram showing the cross-section structure of an array substrate provided by an embodiment of the present disclosure. As shown in FIG. 2, the present embodiment provides an array substrate, the array substrate includes a base substrate 12, the base substrate 12 is divided into a pixel region (display area) 11 and a peripheral circuit region 10. The pixel region 11 includes a gate electrode 13, a gate insulation layer 15, a semiconductor active layer 16, a pixel electrode 17, a source electrode 18 and a drain electrode 19, a passivation layer 111 and a common electrode 112 sequentially located on the base substrate, and the peripheral circuit region 10 includes a first circuit line 21 formed by a gate metal layer, the gate insulation layer 15, a second circuit line 22 formed by a source/drain metal layer and the passivation layer 111 sequentially located on the base substrate 12. That is, the gate electrode 13 in the pixel region and the first circuit line 12 in the peripheral circuit region 10 are formed by the gate metal layer, and the source electrode 18 and the drain electrode 19 in the pixel region and the second circuit line 22 in the peripheral circuit region 10 are formed by the source/drain metal layer. The orthogonal projection area of the second circuit line 22 on the base substrate 12 is at least partly overlapped with the orthogonal projection area of the first circuit line 21 on the base substrate 12, and the second circuit line 22 is directly electrically connected with the first circuit line 21 through the via holes penetrating the gate insulation layer 15.

As shown in the drawing, the semiconductor active layer 16 and the pixel electrode 17 are formed on the gate insulation layer 15, and a source/drain electrode (the source electrode 18 or the drain electrode 19) are formed on the semiconductor active layer 16 and the pixel electrode 17, to connect the pixel electrode 17 to the semiconductor active layer 16.

As shown in the drawing, the common electrode 112 may include a plurality of slits parallel with each other, and between these slits, there are electrodes stripes parallel with each other.

For example, in the embodiment of the present disclosure, the materials for forming the first circuit line 21 and the second circuit line 22 may be the same. Of course, the materials for forming the first circuit lien 21 and the second circuit line 22 can be different from each other. For example, in the embodiment of the present disclosure, the materials for the first circuit line 21 and the second circuit line 22 may be a copper (Cu) layer or a Molybdenum/Aluminum/Molybdenum (Mo/Al/Mo) composite layer. In the embodiment of the present disclosure, the materials for the first circuit line 21 and the second circuit line 22 may also be metal materials, such as Aluminum (Al), Molybdenum (Mo), and so on. The embodiment of the present would not limit the particular material for the first circuit line 21 and the second circuit line 22.

Figure 3:
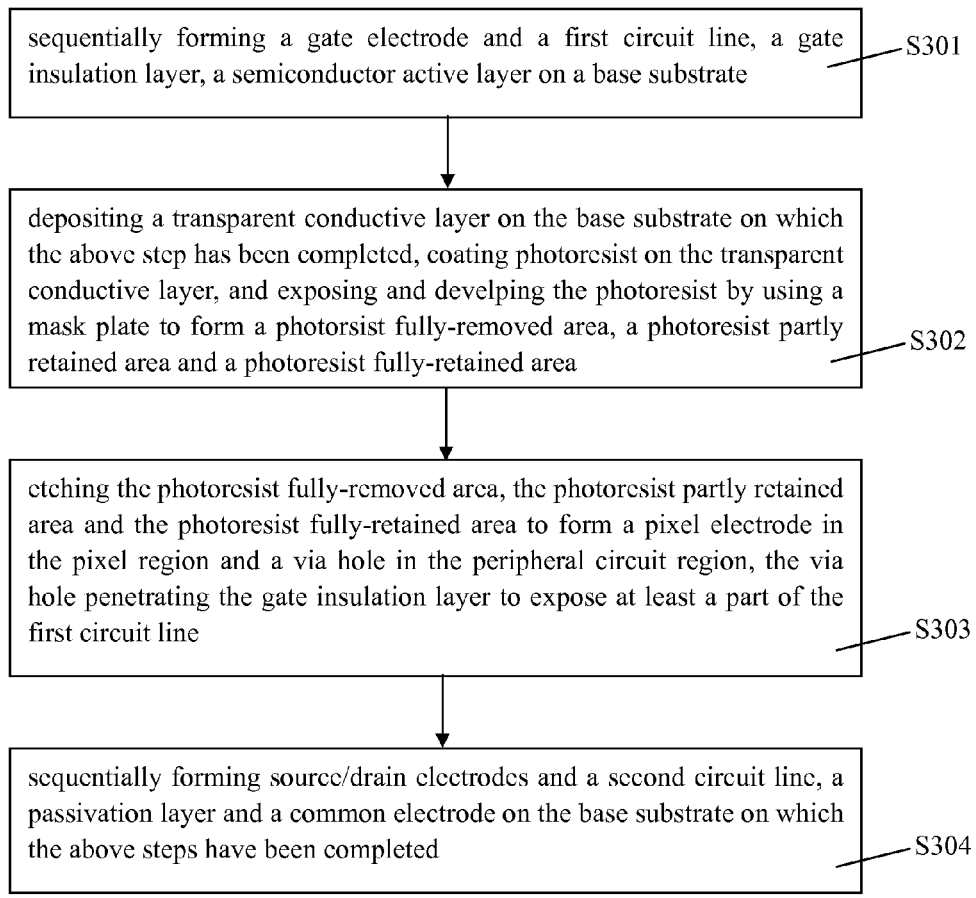
FIG. 3 is a flowchart diagram showing a method for manufacturing an array substrate provided by an embodiment of the present disclosure.

As shown in FIG. 3, another embodiment of the present disclosure also provides a method for manufacturing an array substrate, the method includes the following steps.

S301, sequentially forming a gate electrode and a first circuit line, a gate insulation layer, a semiconductor active layer on a base substrate. The gate electrode is formed in a pixel region and the first circuit line is formed in a peripheral circuit region.

S302, depositing a transparent conductive layer on the base substrate on which the above step has been completed, coating photoresist on the transparent conductive layer, and exposing and developing the photoresist by using a mask plate to form a photoresist fully-removed area, a photoresist partly retained area and a photoresist fully-retained area. The photoresist fully-retained area corresponds to the area in which the pixel electrode is to be formed, the orthogonal projection area of the photoresist fully-removed area on the base substrate is at least partly overlapped with the orthogonal projection area of the first circuit line on the base substrate.

S303, etching the photoresist fully-removed area, the photoresist partly retained area and the photoresist fully-retained area to form a pixel electrode in the pixel region and a via hole in the peripheral circuit region, the via hole penetrating the gate insulation layer to expose at least a part of the first circuit line.

S304, sequentially forming source/drain electrodes and a second circuit line, a passivation layer and a common electrode on the base substrate on which the above steps have been completed. The source/drain electrodes are located in the pixel region and the second circuit line is located in the peripheral circuit region and is electrically connected with the first circuit line through the via hole.

Hereinafter, the process for manufacturing the array substrate according to the embodiment of the present disclosure will be described in detail, in connection with the attached drawings.

Figure 4:
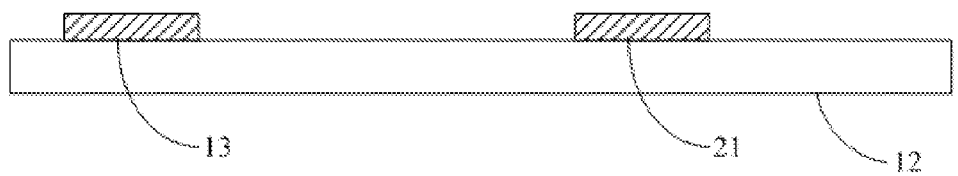
FIG. 4 to FIG. 11 are schematic diagrams showing the cross-section structure of an array substrate provided by an embodiment of the present disclosure at various stages during the manufacturing process, respectively.

As shown in FIG. 4, firstly, a layer of metal layer film is deposited on the base substrate 12. In the embodiment of the present disclosure, the base substrate 12 may be a glass substrate, and may also by other kind of substrate, for example, a plastic substrate, a quartz substrate, and is not particularly limited.

In the embodiment of the present disclosure, the material for the metal layer film is a metal material such as, metal copper (Cu), metal molybdenum (Mo), metal aluminum (Al), a stack layer of Mo/Al/Mo, or the like. The metal layer film is not limited to any particular material in the embodiment of the present disclosure. After that, a layer of photoresist is coated on the metal layer film and then is subjected to exposure, development, etching and patterning process to remove the remaining photoresist, to form a gate electrode 13 and a first circuit line 21, the first circuit line 21 is located in a peripheral circuit region of the base substrate 12. At this time, a gate line (not shown in the drawing) connected with the gate electrode 13 can be simultaneously formed.

Figure 5:
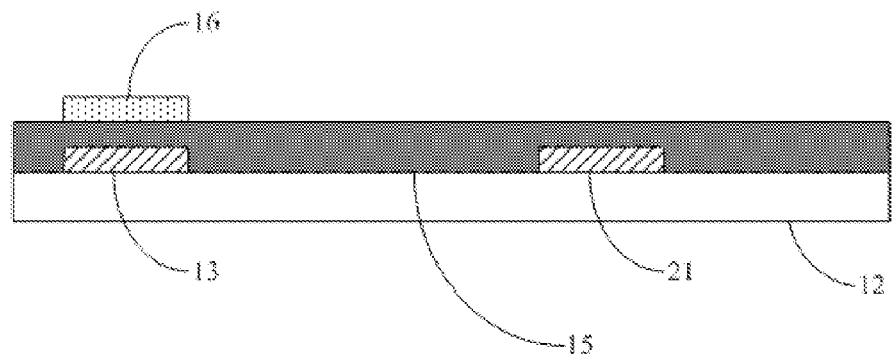

As shown in FIG. 5, on the base substrate on which the process in FIG. 4 has been completed, a gate insulation layer 15 is formed by, for example, chemical vapor deposition method, sputtering method, or the like. The material for the gate insulation layer 15 can be silicon oxide, silicon nitride, silicon oxynitride, or the like, and there is no limitation on the material for the gate insulation layer in the embodiment of the present disclosure.

Next, on the gate insulation layer 15, a semiconductor layer is formed by, for example, chemical vapor deposition method, sputtering method, or the like, and then a semiconductor active layer 16 is formed by a patterning process. The semiconductor layer can be amorphous silicon, poly-silicon, oxide semiconductor (e.g. IGZO), and so on, and an ohmic contact layer may be additionally formed if it is needed.

Figure 6:
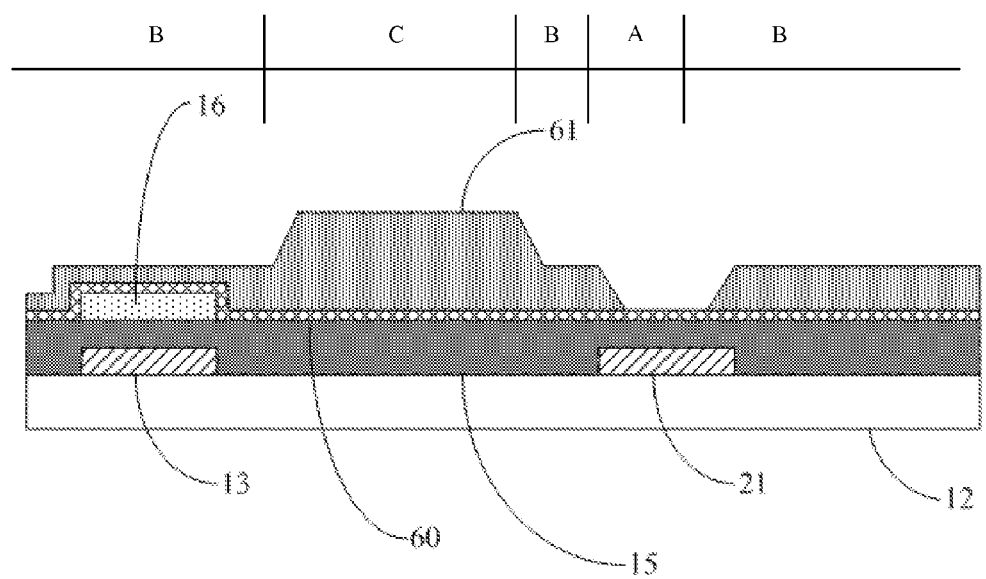

As shown in FIG. 6, on the base substrate 12 on which the process in FIG. 5 has been completed, a transparent conductive layer 60 is deposited, a layer of photoresist 61 is coated on the transparent conductive layer 60, and then is subjected from exposure, development by using a mask plate, to form a photoresist fully-removed area A, a photoresist partly-retained area B and a photoresist fully-retained area C. The photoresist fully-retained area C corresponds to the area in which a pixel electrode is formed, and the orthogonal projection area of the photoresist fully-removed area A on the base substrate 12 is at least partly overlapped with the orthogonal projection area of the first circuit line 21 on the base substrate 12. In the embodiment of the present disclosure, the mask plate for obtaining the above pattern of the photoresist may be a half-tone mask plate or a gray tone mask plate, which include a light shielding area, a fully transmitting area, and a partly transmitting area. When the half-tone mask plate or the gray tone mask plate is used to perform exposure of photoresist and then development is conducted, and if the photoresist in the embodiment of the present disclosure is positive photoresist, the photoresist fully-removed area corresponds to the fully transmitting area of the half-tone mask plate or the gray tone mask plate, the photoresist partly retained area corresponds to the partly transmitting area of the half-tone mask plate or the gray tone mask plate, and the photoresist fully-retained area corresponds to the light shielding area of the half-tone mask plate or the gray tone mask plate. Of course, the photoresist in the embodiment of the present disclosure may also be a negative photoresist, and when the photoresist is negative photoresist, the photoresist fully-removed area corresponds to the light shielding area of the half-tone mask plate, and the photoresist fully-retained area corresponds to the fully transmitting area of the half-tone mask plate or the gray tone mask plate.

Figure 7:
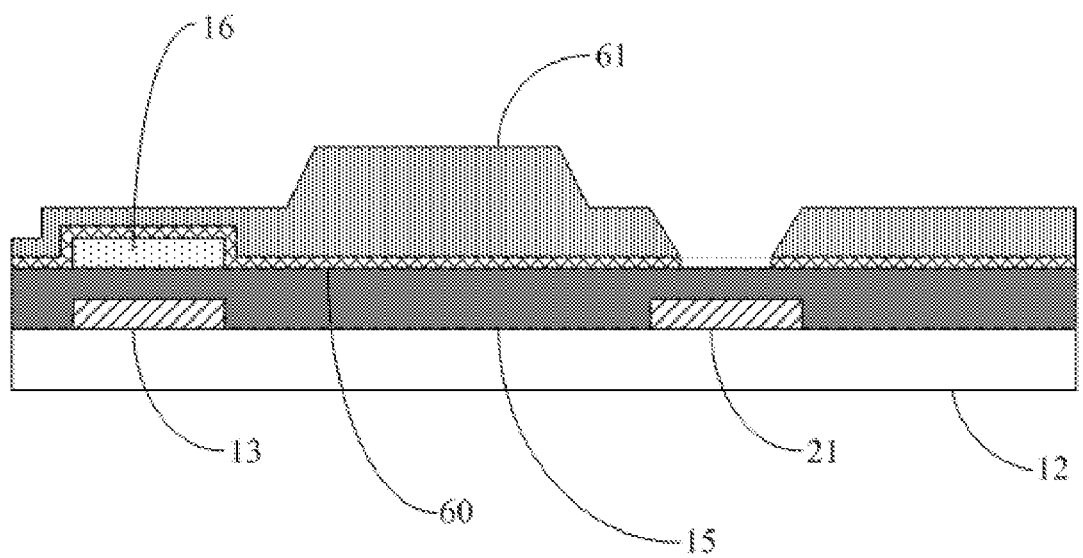
Figure 8:
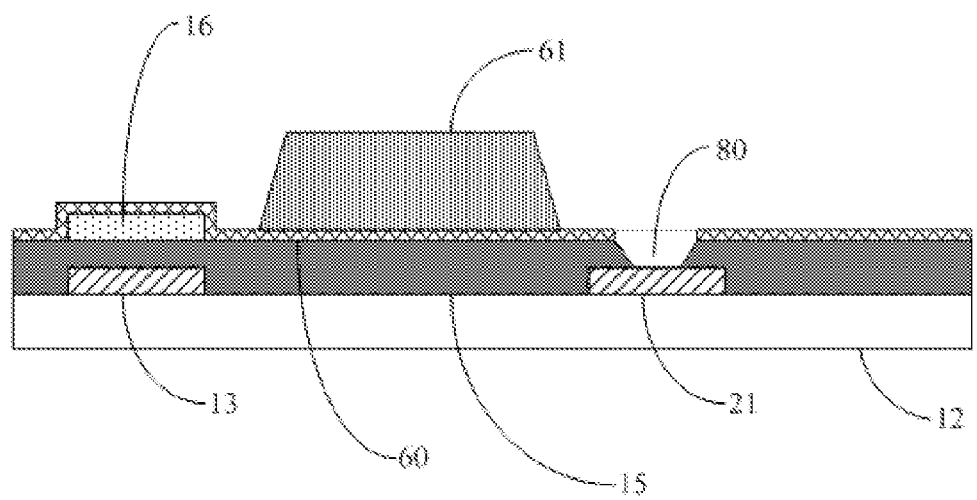

As shown in FIG. 7, a first etching process is performed on the base substrate 12 on which the process in FIG. 5 has been completed, to remove the transparent conductive layer 60 in the photoresist fully-removed area A and thus expose the gate insulation layer 15 below the transparent conductive layer 60. It is preferred that the first etching in the embodiment of the present disclosure employs wet etching. Next, by a second etching process, a via hole 80 is formed, as shown in FIG. 8, the via hole 80 penetrates the gate insulation layer 15, and at least expose a part of the first circuit line 21 and remove the photoresist in the photoresist partly-retained area to expose the transparent conductive layer corresponding to the photoresist partly-retained area. It is preferred that the second etching process in the embodiment of the present disclosure employs dry etching, by which the photoresist in the photoresist partly-retained area can be removed at the same time, and thus the operation steps can be reduced. Next, by a third etching process, the exposed transparent conductive layer is removed, it is preferred that the third etching process in the embodiment of the present disclosure employs wet etching.

Figure 9:
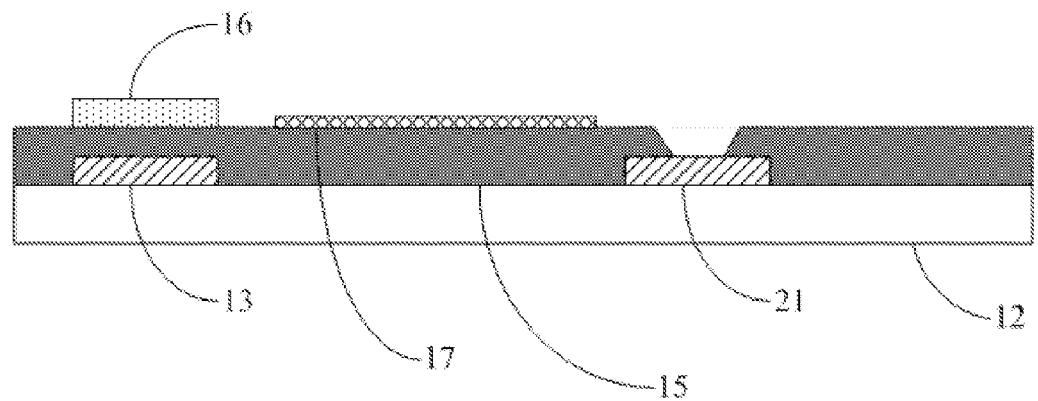

Finally, the photoresist in the photoresist fully-retained area is removed to form a pixel electrode 17, as shown in FIG. 9, the pixel electrode 17 is located on the gate insulation layer and on the same layer as the semiconductor active layer 16. In the embodiment of the present disclosure, the material for the pixel electrode may be a single film of indium tin oxide or indium zinc oxide, or a composite film of indium tin oxide and indium zinc oxide, and there is no specific limitation on the material of the pixel electrode in the embodiment of the present disclosure.

Figure 10:
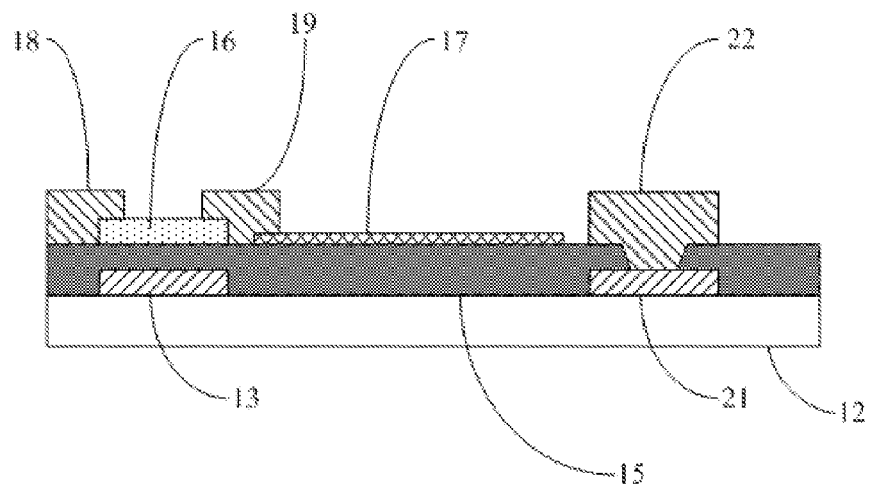

As shown in FIG. 10, on the base substrate 12 on which the process in FIG. 9 has been completed, a layer of metal layer film is deposited. In the embodiment of the present disclosure, the material for the metal layer film may be a metal material, such as metal copper (Cu), metal molybdenum (Mo), metal aluminum (Al), a stack layer of Mo/Al/Mo, and so on, and there is no specific limitation on the material of the metal layer film in the embodiment of the present disclosure. It is preferred that the material for the metal layer film is the same material as that of the metal layer film for forming the gate electrode 13 and the first circuit line 21. After that, photoresist is coated on the metal layer film and then is subjected from exposure, development, etching and patterning process for removing the photoresist, to form a source electrode 18, a drain electrode 19 and a second circuit line 22. The second circuit line 22 is located in the peripheral circuit region of the base substrate, and the second circuit line 22 is directly electrically connected with the first circuit line 21 through the via hole penetrating the gate insulation layer 15. The source electrode 18 and the drain electrode 19 are formed on the semiconductor active layer 16 and the pixel electrode 17, and the drain electrode 19 electrically connects the semiconductor actively layer 16 and the pixel electrode 17.

Figure 11:
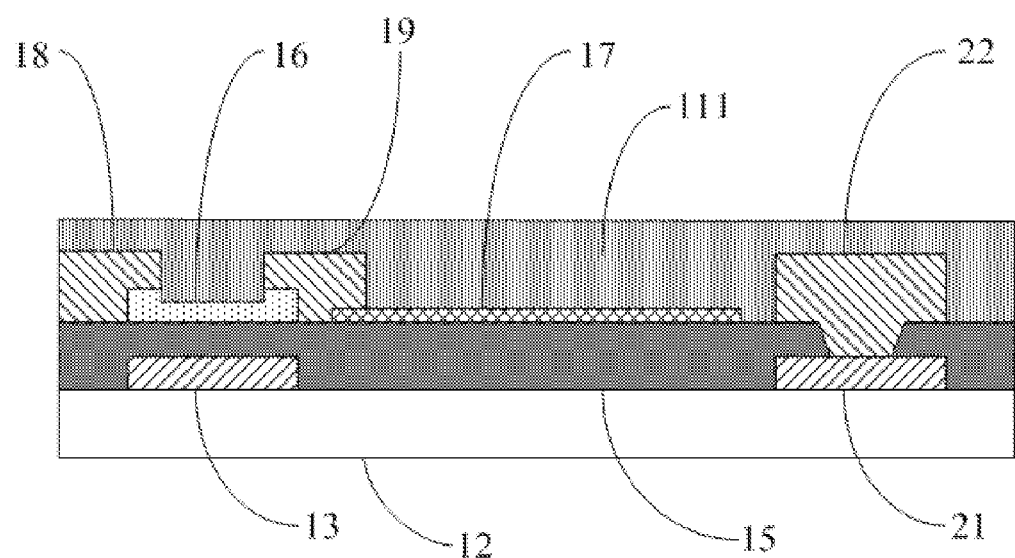

As shown in FIG. 11, on the base substrate 12 on which the process in FIG. 10 has been completed, a passivation layer 111 is formed, the material for the passivation layer 111 may be silicon oxide, silicon nitride, silicon oxynitride, or the like, and there is no specific limitation on the material of the passivation layer in the embodiment of the present disclosure. Finally, a transparent conductive layer is formed on the passivation layer 111, then the transparent conductive layer is patterned to obtain a common electrode, and thus the array substrate as shown in FIG. 2 is obtained. In the embodiment of the present disclosure, the material for the common electrode 112 may be a single film of indium tin oxide or indium zinc oxide or a composite film of indium tin oxide and indium zinc oxide, there is no limitation on the material of the common electrode in the embodiment of the present disclosure. The common electrode 112 may include a plurality of slits parallel with each other, and between these slits, there are electrode stripes parallel with each other.

In summary, in the array substrate provided according to an embodiment of the present disclosure, the first circuit line and the second circuit line in the peripheral circuit region of the array substrate are directly connected, by which the via hole and the transparent electrode in the peripheral circuit for connecting the circuit line formed by the gate metal layer and the circuit line formed by the source/drain metal layer can be effectively avoided, and thus, the area of the peripheral circuit can be reduced.

An embodiment of the present disclosure further provides a display device including the array substrate according to any one of the above embodiments. The display device can be a liquid crystal display device, in which the array substrate is opposite to a counter substrate to form a liquid crystal cell in which liquid crystal material is filled. The counter substrate for example is a color filter substrate. The pixel electrode of each of the pixel units in the array substrate is applied with electrical field, to control the rotation of the liquid crystal material and thus to perform display operation. In certain examples, the liquid crystal display device further includes a backlight source for providing backlight to the array substrate.

The liquid crystal display device, for example, can be implemented as liquid crystal display panel, electronic paper, organic light emitting diode (OLED) panel, mobile phone, tablet computer, television, display, laptop computer, digital photo frame, navigator, and any other product or components having display function.

The present disclosure has been described above by way of the exemplary embodiment, and the protection scope of the present disclosure would not be limited therein, and is only defined by the following claims.

The present application claims the priority of Chinese Patent Application No. 201510067673.3 filed on Feb. 9, 2015, the Chinese Patent Application is entirely incorporated therein as a part of the present application by reference.

What is claimed is:

1. An array substrate including a base substrate, wherein the base substrate is divided into a pixel region and a peripheral circuit region,
    the pixel region comprises a gate electrode, a gate insulation layer, a semiconductor active layer, a pixel electrode, a source/drain electrode, a passivation layer and a common electrode sequentially located on the base substrate;
    the peripheral circuit region includes a first circuit line, the gate insulation layer, a second circuit line and the passivation layer sequentially located on the base substrate, an orthogonal projection area of the second circuit line on the base substrate is at least partly overlapped with orthogonal projection area of the first circuit line on the base substrate, and the second circuit line is directly electrically connected with the first circuit line through a via hole penetrating the gate insulation layer.

2. The array substrate according to claim 1, wherein the first circuit line and the gate electrode are formed by a gate metal layer.

3. The array substrate according to claim 1, wherein the second circuit line and the source/drain electrode are formed by a source/drain metal layer.

4. The array substrate according to claim 1, wherein the semiconductor active layer and the pixel electrode are formed on the gate insulation layer, the source/drain electrode is formed on the semiconductor active layer and the pixel electrode, so as to connect the pixel electrode to the semiconductor active layer.

5. The array substrate according to claim 1, wherein the common electrode includes a plurality of slits parallel with each other.

6. A display device including the array substrate according to claim 1.

7. The array substrate according to claim 1, wherein materials for the first circuit line and the second circuit line are the same.

8. The array substrate according to claim 7, wherein the materials for the first circuit line and the second circuit line are copper, or a stack layer of molybdenum/aluminum/molybdenum.

* * * * *